(12) United States Patent
Liou

(10) Patent No.: US 8,637,975 B1
(45) Date of Patent: Jan. 28, 2014

(54) SEMICONDUCTOR DEVICE HAVING LEAD WIRES CONNECTING BONDING PADS FORMED ON OPPOSITE SIDES OF A CORE REGION FORMING A SHIELD AREA

(75) Inventor: Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/601,442

(22) Filed: Aug. 31, 2012

Related U.S. Application Data

(60) Continuation of application No. 11/024,309, filed on Dec. 28, 2004, now Pat. No. 8,258,616, which is a continuation-in-part of application No. 10/780,605, filed on Feb. 19, 2004, now Pat. No. 6,982,220, which is a division of application No. 10/051,965, filed on Jan. 16, 2002, now Pat. No. 6,770,982.

(51) Int. Cl.
*H01L 23/48* (2006.01)

(52) U.S. Cl.
USPC ..... 257/692; 257/779; 257/784; 257/E23.024

(58) Field of Classification Search
USPC ........... 257/665, 690, 692, 779, 784, E23.024
See application file for complete search history.

(56) References Cited

U.S. PATENT DOCUMENTS

| | | | |
|---|---|---|---|
| 4,359,754 A | 11/1982 | Hayakawa et al. | |
| 4,403,240 A | 9/1983 | Seki et al. | |
| 5,384,487 A | 1/1995 | Rostoker et al. | |
| 5,495,398 A | 2/1996 | Takiar et al. | |
| 5,838,072 A | 11/1998 | Li et al. | |
| 5,869,870 A | 2/1999 | Lin | |
| 5,905,639 A | 5/1999 | Warren | |
| 5,960,262 A | 9/1999 | Torres et al. | |
| 5,986,345 A | 11/1999 | Monnot | |
| 5,989,939 A | 11/1999 | Fjelstad | |
| 6,025,616 A | 2/2000 | Nguyen et al. | |
| 6,043,539 A | 3/2000 | Sugasawara | |
| 6,091,140 A | 7/2000 | Toh et al. | |
| 6,097,098 A | 8/2000 | Ball | |
| 6,107,681 A | 8/2000 | Lin | |
| 6,144,093 A | 11/2000 | Davis et al. | |
| 6,169,331 B1 | 1/2001 | Manning et al. | |
| 6,211,565 B1 | 4/2001 | Yu | |
| 6,246,113 B1 | 6/2001 | Lin | |
| 6,348,400 B1 | 2/2002 | Schoenfeld | |
| 6,424,223 B1 | 7/2002 | Wang | |

*Primary Examiner* — Anh Mai

(57) ABSTRACT

A semiconductor device includes a semiconductor die. The semiconductor die includes a first bond pad having a plurality of connection points, the first bond pad arranged on a first portion of the semiconductor die, wherein the first portion corresponds to an outer periphery of the semiconductor die, and a second bond pad and a third bond pad arranged within a second portion of the semiconductor die, wherein the second portion is within the outer periphery of the semiconductor die. A lead external to the semiconductor die is configured to provide a voltage potential to the semiconductor die. A first lead wire is connected between the lead and a first connection point. A second lead wire is connected between the second bond pad and a second connection point. A third lead wire is connected between the third bond pad and a third connection point.

10 Claims, 6 Drawing Sheets

SEMICONDUCTOR DEVICE HAVING LEAD WIRES CONNECTING BONDING PADS FORMED ON OPPOSITE SIDES OF A CORE REGION FORMING A SHIELD AREA

CROSS-REFERENCE TO RELATED APPLICATIONS

This application is a continuation of U.S. patent application Ser. No. 11/024,309 (now U.S. Pat. No. 8,258,616), filed on Dec. 28, 2004, which is a continuation-in-part of U.S. patent application Ser. No. 10/780,605 (now U.S. Pat. No. 6,982,220) filed on Feb. 19, 2004, which is a divisional of U.S. patent application Ser. No. 10/051,965 (now U.S. Pat. No. 6,770,982), filed Jan. 16, 2002. The entire disclosures of the above applications are incorporated herein by reference.

TECHNICAL FIELD

This invention relates to power and signal distribution in semiconductor dies.

BACKGROUND

Many conventional semiconductors are mounted in packages such as Quad Flat Packs (QFPs) and Pin Ball Gate Arrays (PBGAs) in which the input and output terminals are arranged along the edge of the die. Arranging the terminals along the die edge may result in relatively long wirings on silicon to supply power and ground to the center of the die. These long wirings generally have a relatively high resistance leading to unacceptable IR voltage drops.

SUMMARY

An integrated circuit according to some implementations comprises a semiconductor die including N bond pad pairs each including a first bond pad and a second bond pad that is spaced from the first bond pad. N bond wires are provided, each associated with a respective one of the N bond pad pairs. Each of the bond wires has opposite ends that communicate with the first and second bond pads of a respective one of the N bond pad pairs. The first and second bond pads of the N bond pad pairs are connected to a reference potential and create a shielded area between the N bond pad pairs.

In other features, the bond wires comprise a metallic material selected from the group consisting of gold, aluminum, and copper. The bond wires are bonded to the first and second bond pads using a wire bond type selected from the group consisting of ball bonds, stitch bonds, stitch bonds on bonding pad, and stitch bonds on ball. An interconnecting layer in the semiconductor die is connected by vias to at least one of the first bond pads of at least one of the N bond pad pairs. The reference potential is ground.

In other features, an I/O bond pad is arranged on the semiconductor die. An I/O bond wire has one end that communicates with the lead finger and an opposite end that communicates with the reference potential.

A system comprises the integrated circuit and further comprises a lead finger that communicates with the reference potential and the opposite end of the I/O bond wire.

In still other features, an I/O bond pad directly contacts at least one of the first bond pads of at least one of the N bond pad pairs. The first bond pads of the N bond pad pairs contact each other.

In other features, an I/O bond pad is connected to a first via, which is connected by an interconnecting layer and a second via to at least one of the first bond pads of at least one of the N bond pad pairs.

In still other features, an I/O bond pad directly contacts at least one of the first bond pads of the N bond pad pairs. Remaining ones of the first bond pads are connected by vias and an interconnecting layer to the at least one of the first bond pads.

In other features, an I/O bond pad is connected to a first via, which is connected to by an interconnecting layer and a second via to at least one of the first bond pads of the N bond pad pairs. Remaining ones of the first bond pads are directly connected to the at least one of the first bond pads. A circuit is fabricated in the semiconductor die in the shielded area.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF DRAWINGS

The present disclosure will become more fully understood from the detailed description and the accompanying drawings, wherein.

Like reference symbols in the various drawings indicate like elements.

DETAILED DESCRIPTION

Figure 1:
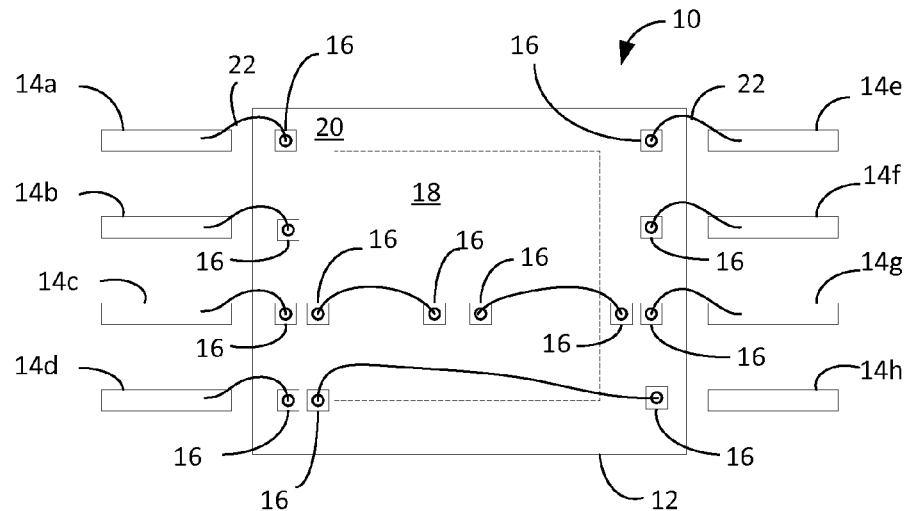
FIG. 1 is a two-dimensional top-view of a semiconductor device.

FIG. 1 shows a top-view of a semiconductor power distribution system and method. A semiconductor device 10 includes a semiconductor die 12 and several lead fingers 14a-14h. The semiconductor device 10 may be mounted in any suitable package such as QFPs and PBGAs.

The semiconductor die 12 includes bonding surfaces 16 arranged in an interior portion 18 of the semiconductor die 12 as well as along an outer periphery 20 of the semiconductor die 12. The bonding surfaces 16 are preferably bonding pads connected to traces in the semiconductor die 12. The bonding surfaces 16 provide connection points for lead wires 22 extending to other bonding surfaces 16 or lead fingers 14. Employing a lead wire 22 within the interior portion 18 may advantageously reduce the voltage drop caused by IR losses in a trace. In addition, a lead wire 22 may be used in place of a trace to reduce the density of traces within the semiconductor die 12. Using a lead wire 22 to couple electrical signals to internal portions of the semiconductor 12 may be particularly advantageous in high density semiconductors where using wide low resistance traces to carry the signal would require additional layers. In one example, a lead wire 22 may be connected in parallel with a trace in the semiconductor die 18 to reduce the combined resistance, thereby decreasing the voltage drop associated with the trace. In a second example, a lead wire 22 may be used in lieu of using a trace within the semiconductor die 18. In a third example, a lead wire may be connected from a bonding surface 16 located along one edge of the semiconductor periphery 20 to another bonding surface 16 located along another edge of the semiconductor periphery 20.

The lead wires 22 are bonded to different ones of the bonding surfaces 16 and/or lead finger 14 to provide low resistance connections for electrical signals such as power, ground, and signals. The lead wires 14 may comprise an electrically conductive material such as gold, aluminum, and copper that has a low electrical resistance. Each of the lead fingers 14 may be coupled to a bonding surface or remain as a non-connected lead finger 14h. Any wire bonding method such as thermocompression and ultrasonic may be used to bond the lead wires 14 to the bonding surfaces 16 and lead fingers 14.

The lead wires 22 may be bonded using any wire bond type such as ball bond, stitch bond on bonding pad, and stitch bond on ball. A ball bond may be formed by first forming a sphere at the end of a lead wire. Then, the sphere is pressed against a bonding surface for a few seconds to form a weld. A stitch bond on bonding pad may be formed by placing the tail of a lead parallel to a bonding surface. Then, pressure is applied to the lead wire forcing the lead wire onto the bonding pad. A stitch bond on ball may be formed in similar manner to forming a stitch bond on bonding pad, except a ball is first formed on the bonding surface.

Figure 2:
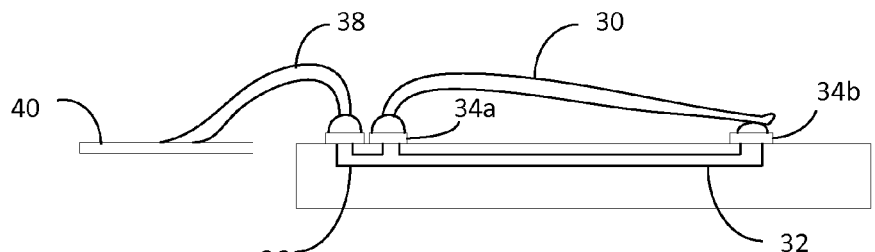
FIG. 2 is a two-dimensional side-view of a semiconductor device.

FIG. 2 shows another aspect of the semiconductor power distribution system. A lead wire 30 is connected in parallel with a trace 32 to reduce the electrical resistance of a connection between two bonding surfaces 34a and 34b. The lead wire 30 may be connected via a trace 36 to another lead wire 38 that is connected to a lead finger 40. The lead wire 30 reduces the voltage losses associated with the electrical resistance of the trace 32 by providing a parallel path for current.

Figure 3:
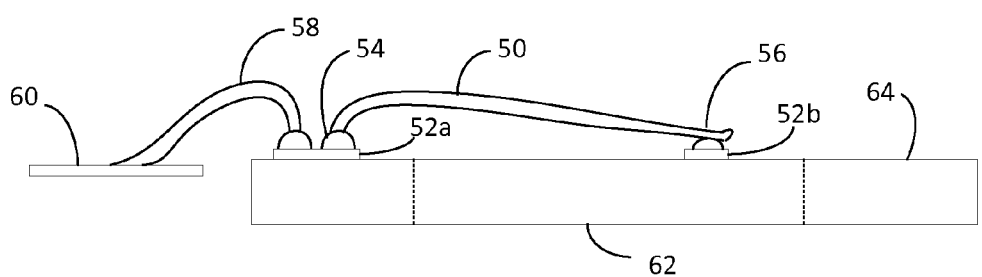
FIG. 3 is a two-dimensional side-view of a semiconductor device.

FIG. 3 shows another aspect of the semiconductor power distribution system and method. A lead wire 50 is connected between two bonding surfaces 52a and 52b. The bonding surface 52b is preferably located within an interior portion 62 of a semiconductor die 64. The lead wire 50 is used in lieu of a trace to carry electrical signals between the bonding surfaces 52a and 52b. The lead wire 50 may be coupled to the bonding surfaces 52a and 52b via a ball bond 54 and a stitch bond on ball 56 respectively. Another lead wire 58 may connect the bonding surface 52a to a lead finger 60 so that signals may be coupled between the lead finger 60 and the interior portion 62 of the semiconductor die 64 without traversing within the semiconductor die 64.

Figure 4:
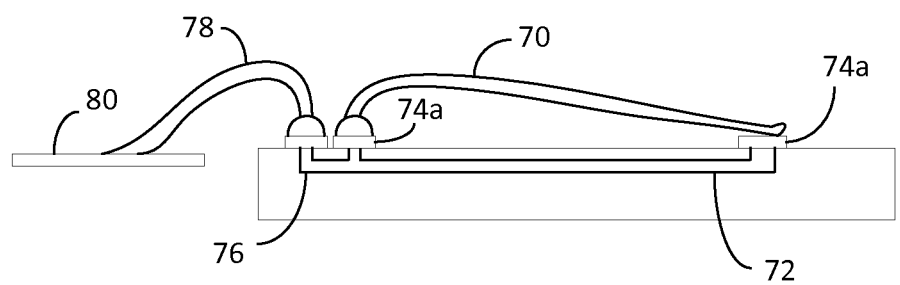
FIG. 4 is a two-dimensional side-view of a semiconductor device.

FIG. 4 shows another aspect of the semiconductor power distribution system and method similar to that shown in FIG. 2 in function with corresponding elements numbered in the range 70 to 80, except that the lead wire 70 is connected at bonding surface 74b with a stitch on pad type of bond.

Figure 5:
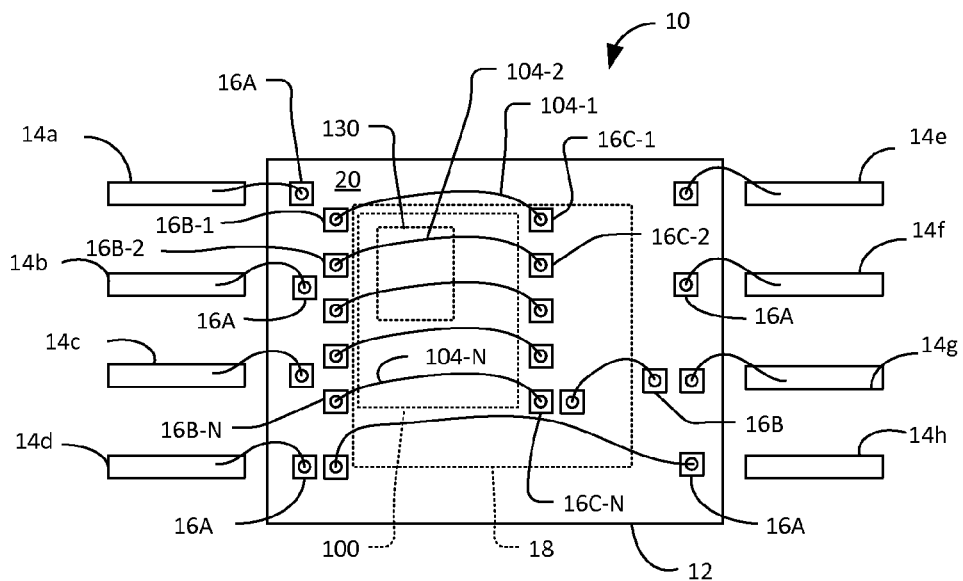
FIG. 5 is a two-dimensional top-view of a semiconductor device with a shielded area of a semiconductor die located between bond surfaces connected by bond wires according to some implementations.

Referring now to FIG. 5, a two-dimensional top-view of a semiconductor device 10 is shown. The semiconductor device 10 includes one or more shielded areas 100 that are located between bonding surfaces 16B-1, 16B-2, . . . and 16B-N (collectively bonding surfaces 16B) in the outer periphery 20 and bonding surfaces 16C-1, 16C-2, . . . and 16C-N (collectively bonding surfaces 16C) in the inner portion 18.

Bonding surfaces 16A are associated with input/output connections to lead fingers 14 as previously described above, although other methods of connecting the reference potential may be used. The shielded areas 100 are located between bonding pads 16B and 16C that are connected by bond wires 104-1, 104-2, . . . , and 104-N (collectively bond wires 104). As can be appreciated, while a generally rectangular shielded area 100 is shown in FIG. 5, the shielded area 100 can have any other suitable shape or size.

Figure 6:
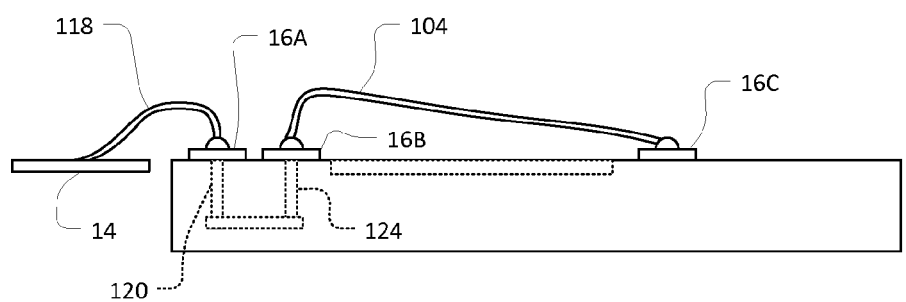
FIG. 6 is a simplified and enlarged two-dimensional side-view of the semiconductor device of FIG. 5.

Referring now to FIG. 6, a side view of the semiconductor device 10 is shown. Ground or another reference potential is connected to one or more lead fingers 14. One or more input/output (I/O) bond wires 118 connect the lead fingers 118 to the bonding surfaces 16A. One or more vias 120 connect the bonding surfaces 16A to one or more interconnecting layers 122. One or more vias 124 connect the one or more interconnecting layers 122 to bonding surfaces 16B. As can be appreciated, the interconnecting layers and additional vias can optionally be used to provide a connection to bonding surfaces 16C. Still other approaches may be used to supply ground or another reference potential to the bonding surfaces 16B and 16C. As can be appreciated by skilled artisans, the shielded areas 100 have reduced interference and/or crosstalk as compared to unshielded areas. Therefore, one or more circuits 130 may be fabricated in the shielded areas 100. For example, the circuits 130 may be particularly sensitive to interference and/or crosstalk.

Figure 7:
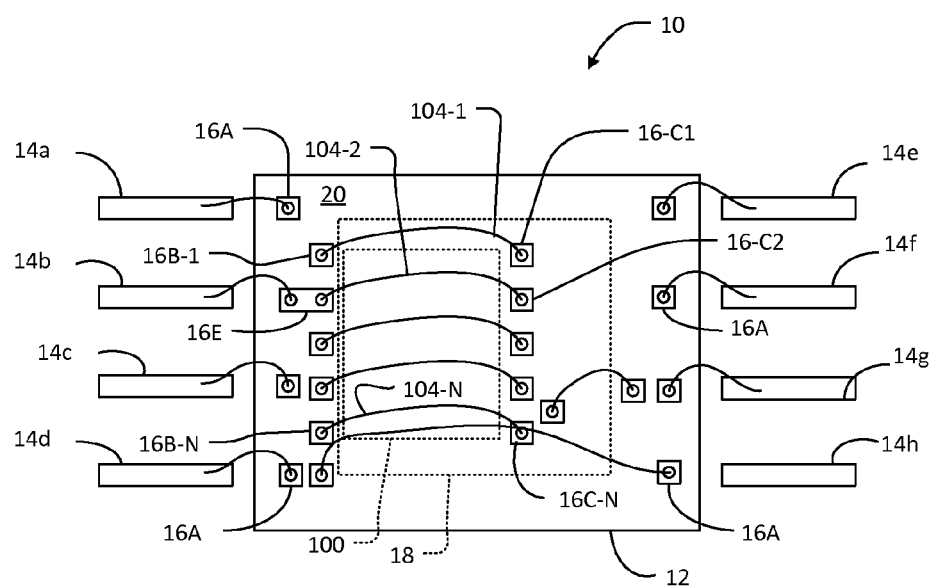
FIG. 7 is a two-dimensional top-view of a semiconductor device with a shielded area of a semiconductor die located between bond surfaces connected by bond wires according to some implementations.
Figure 8:
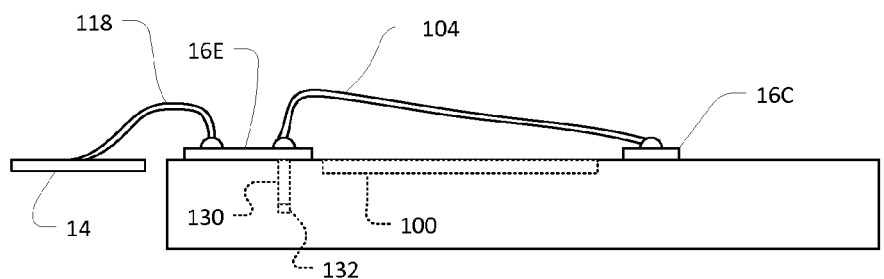
FIG. 8 is a simplified and enlarged two-dimensional side-view of the semiconductor device of FIG. 7.

Referring now to FIGS. 7 and 8, the use of vias and interconnecting layers between the I/O pad 16A and the bonding surfaces 16B can be omitted if ground or another reference potential is directly connected to the bonding surfaces 16B as shown. In other words, at least one of the bonding surfaces 16A that is connected to the reference potential is directly connected to one or more of the bonding surfaces 16B as shown at 16E. One or more of the remaining bonding surfaces 16B are connected by vias 130 and interconnecting layer 132 as shown and/or using additional direct connections, bond wires or other connection types.

Figure 9:
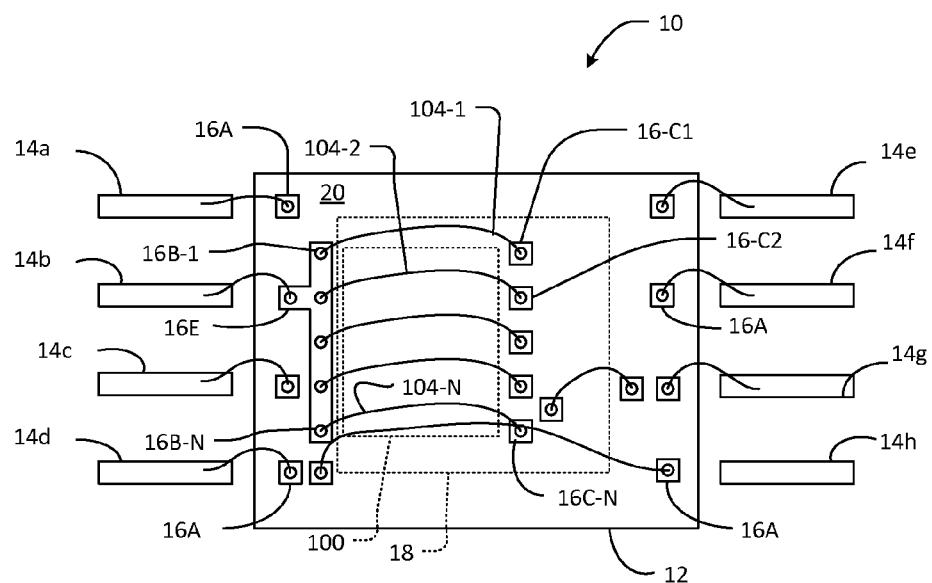
FIG. 9 is a two-dimensional top-view of a semiconductor device with a shielded area of a semiconductor die located between bond surfaces connected by bond wires according to some implementations.
Figure 10:
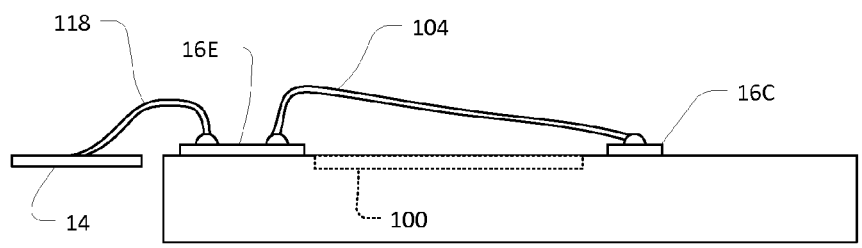
FIG. 10 is a simplified and enlarged two-dimensional side-view of the semiconductor device of FIG. 9.

Referring now to FIGS. 9 and 10, the use of vias and interconnecting layers can be omitted and/or used in other ways if ground or another reference potential is directly connected by the I/O bonding surface 16A to the bonding pads 16B and the bonding surfaces 16B are also directly connected as shown. While several examples of vias and direct connections are shown in FIGS. 5-10, skilled artisans will appreciate that any other combination of vias and/or direct connections can be used.

Figure 11:
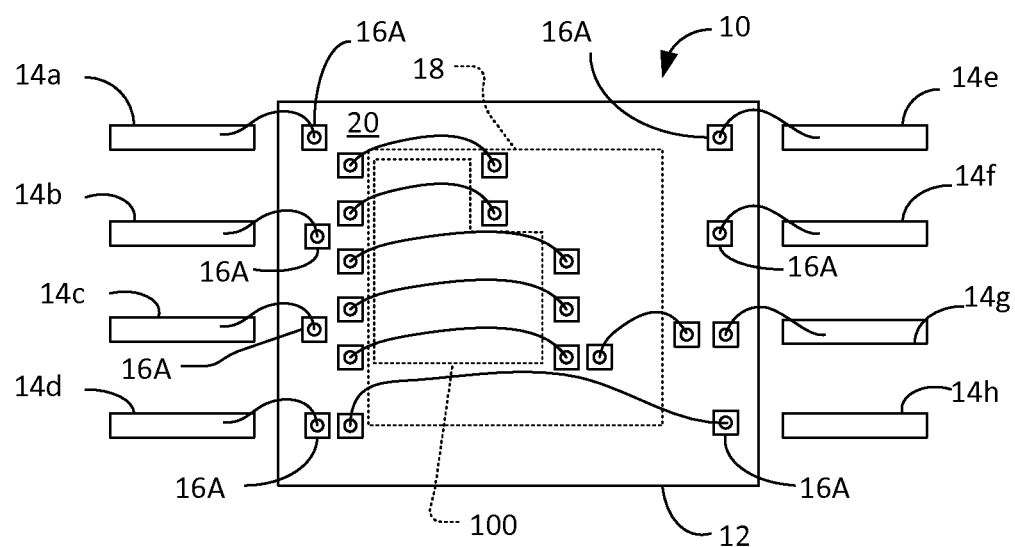
FIG. 11 is a two-dimensional top-view of an alternate semiconductor device of a semiconductor die with a shielded area between bond surfaces connected by bond wires according to some implementations.

Referring now to FIGS. 5, 7, 9 and 11, the shielded area 100 may have a variety of shapes. For example, the shielded area 100 can have a rectangular shape as shown in FIGS. 5, 7 and 9. The shielded area 100 can also have a stair-step shape as shown in FIG. 11 and/or any other shape can be used.

A number of embodiments of the invention have been described. Nevertheless, it will be understood that various modifications may be made without departing from the spirit and scope of the invention. Accordingly, other embodiments are within the scope of the following claims.

What is claimed is:

1. A semiconductor device, comprising:
   a semiconductor die, including:
      a first bond pad having a plurality of connection points, the first bond pad arranged on a first portion of the semiconductor die, wherein the first portion corresponds to an outer periphery of the semiconductor die; and
      a second bond pad and a third bond pad arranged within a second portion of the semiconductor die, wherein the second portion is within the outer periphery of the semiconductor die;
   a lead external to the semiconductor die, the lead configured to provide a voltage potential to the semiconductor die;
   a first lead wire connected between the lead and a first connection point of the plurality of connection points of the first bond pad;
   a second lead wire connected between the second bond pad and a second connection point of the plurality of connection points of the first bond pad; and
   a third lead wire connected between the third bond pad and a third connection point of the plurality of connection points of the first bond pad,
   wherein the lead is configured to provide the voltage potential to each of the second bond pad and the third bond pad via the first lead wire, the first bond pad, and second lead wire, and the third lead wire, respectively.

2. The semiconductor device of claim 1, wherein:
   the semiconductor die includes a trace connected between the first bond pad and the second bond pad; and
   the trace is parallel to the second lead wire.

3. The semiconductor device of claim 1, wherein the plurality of connection points includes at least one of ball bonds, stitch bonds, stitch bonds on bond pad, and stitch bonds on ball.

4. The semiconductor device of claim 1, wherein the voltage potential is a reference potential that is substantially constant.

5. The semiconductor device of claim 4, wherein the reference potential is ground.

6. The semiconductor device of claim 1, wherein the semiconductor device includes a shielded area located between i) the first bond pad, and ii) the second bond pad, and the third bond pad.

7. The semiconductor device of claim 6, wherein the semiconductor die includes a circuit arranged in the shielded area.

8. The semiconductor device of claim 6, wherein upper surfaces of the semiconductor die and the shielded area are coplanar.

9. The semiconductor device of claim 1, wherein the first lead wire, the second lead wire, and the third lead wire comprise a metallic material including at least one of gold, aluminum, and copper.

10. The semiconductor die of claim 1, wherein the semiconductor die includes an interconnecting layer that is connected by vias to at least one of the first bond pad, the second bond pad, and the third bond pad.

* * * * *